(12) United States Patent
Jeong et al.

(10) Patent No.: US 12,178,108 B2
(45) Date of Patent: Dec. 24, 2024

(54) DISPLAY DEVICE AND ELECTRONIC DEVICE INCLUDING THE SAME

(71) Applicant: Samsung Display Co., Ltd., Yongin-Si (KR)

(72) Inventors: Chul Ho Jeong, Seoul (KR); Hyun-Been Hwang, Suwon-si (KR); Seokwon Jang, Seoul (KR); Yongchan Jeon, Cheonan-si (KR); Hirotsugu Kishimoto, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 731 days.

(21) Appl. No.: 17/319,703

(22) Filed: May 13, 2021

(65) Prior Publication Data
US 2022/0005889 A1    Jan. 6, 2022

(30) Foreign Application Priority Data
Jul. 2, 2020   (KR) .......................... 10-2020-0081466

(51) Int. Cl.
| | |
|---|---|
| *H10K 59/65* | (2023.01) |
| *G06F 1/16* | (2006.01) |
| *G09G 3/19* | (2006.01) |
| *G09G 3/38* | (2006.01) |
| *H10K 59/121* | (2023.01) |
| *H10K 59/50* | (2023.01) |

(52) U.S. Cl.
CPC .............. *H10K 59/65* (2023.02); *G09G 3/19* (2013.01); *G09G 3/38* (2013.01); *H10K 59/121* (2023.02); *G06F 1/1686* (2013.01); *H10K 59/50* (2023.02)

(58) Field of Classification Search
None
See application file for complete search history.

(56) References Cited

U.S. PATENT DOCUMENTS

| | | |
|---|---|---|
| 9,690,024 B2 | 6/2017 | Jiao et al. |
| 10,276,640 B2 | 4/2019 | Chung et al. |
| 10,449,901 B2 | 10/2019 | Park et al. |
| 10,530,911 B2 | 1/2020 | Bao |

(Continued)

FOREIGN PATENT DOCUMENTS

| | | |
|---|---|---|
| EP | 3 396 932 | 10/2018 |
| KR | 10-2017-0029041 | 3/2017 |

(Continued)

OTHER PUBLICATIONS

"Color of the elements", curated data provided by Mathematica's ElementData function from Wolfram Research, Inc., downloaded from https://periodictable.com/Properties/A/Color.html on Apr. 23, 2024 (Year: 2024).*

*Primary Examiner* — Dorothy Harris
(74) *Attorney, Agent, or Firm* — F. CHAU & ASSOCIATES, LLC

(57) ABSTRACT

A display device including: a window; a polarizer disposed on the window and including an opening; a display panel disposed below the polarizer and including a first display area and a second display area that has a pixel density lower than that of the first display area, wherein the second display area overlaps the opening of the polarizer; and an optical controller overlapping the second display area and is disposed on the display panel, wherein the optical controller reduces a transmittance of an optical signal.

16 Claims, 13 Drawing Sheets

(56) References Cited

U.S. PATENT DOCUMENTS

| | | | | |
|---|---|---|---|---|
| 2008/0239454 | A1* | 10/2008 | Ichikawa | G02B 26/0841 |
| | | | | 359/290 |
| 2009/0302324 | A1* | 12/2009 | Jiang | H01L 27/1214 |
| | | | | 257/E33.053 |
| 2014/0092466 | A1* | 4/2014 | Wang | G02F 1/167 |
| | | | | 359/296 |
| 2014/0192079 | A1* | 7/2014 | Lee | G09G 3/2003 |
| | | | | 345/597 |
| 2015/0146978 | A1* | 5/2015 | Kato | H04N 19/186 |
| | | | | 382/233 |
| 2017/0070679 | A1* | 3/2017 | Chung | H04N 23/50 |
| 2018/0091772 | A1* | 3/2018 | Han | G06F 3/0484 |
| 2020/0059545 | A1* | 2/2020 | Lee | G06F 1/1637 |
| 2020/0111401 | A1* | 4/2020 | Zhao | G09G 3/2003 |
| 2020/0286436 | A1 | 9/2020 | Lim | |
| 2020/0379295 | A1* | 12/2020 | Wei | G06F 1/1686 |
| 2021/0193756 | A1* | 6/2021 | Oh | H10K 50/80 |
| 2021/0408151 | A1* | 12/2021 | Choi | H10K 59/65 |
| 2021/0408457 | A1* | 12/2021 | Fang | G02F 1/1333 |
| 2021/0408496 | A1* | 12/2021 | Choi | H10K 50/86 |
| 2022/0196890 | A1* | 6/2022 | Wu | H10K 59/65 |

FOREIGN PATENT DOCUMENTS

| | | |
|---|---|---|
| KR | 10-2017-0103159 | 9/2017 |
| KR | 10-2017-0141311 | 12/2017 |
| KR | 10-2019-0091711 | 8/2019 |

* cited by examiner

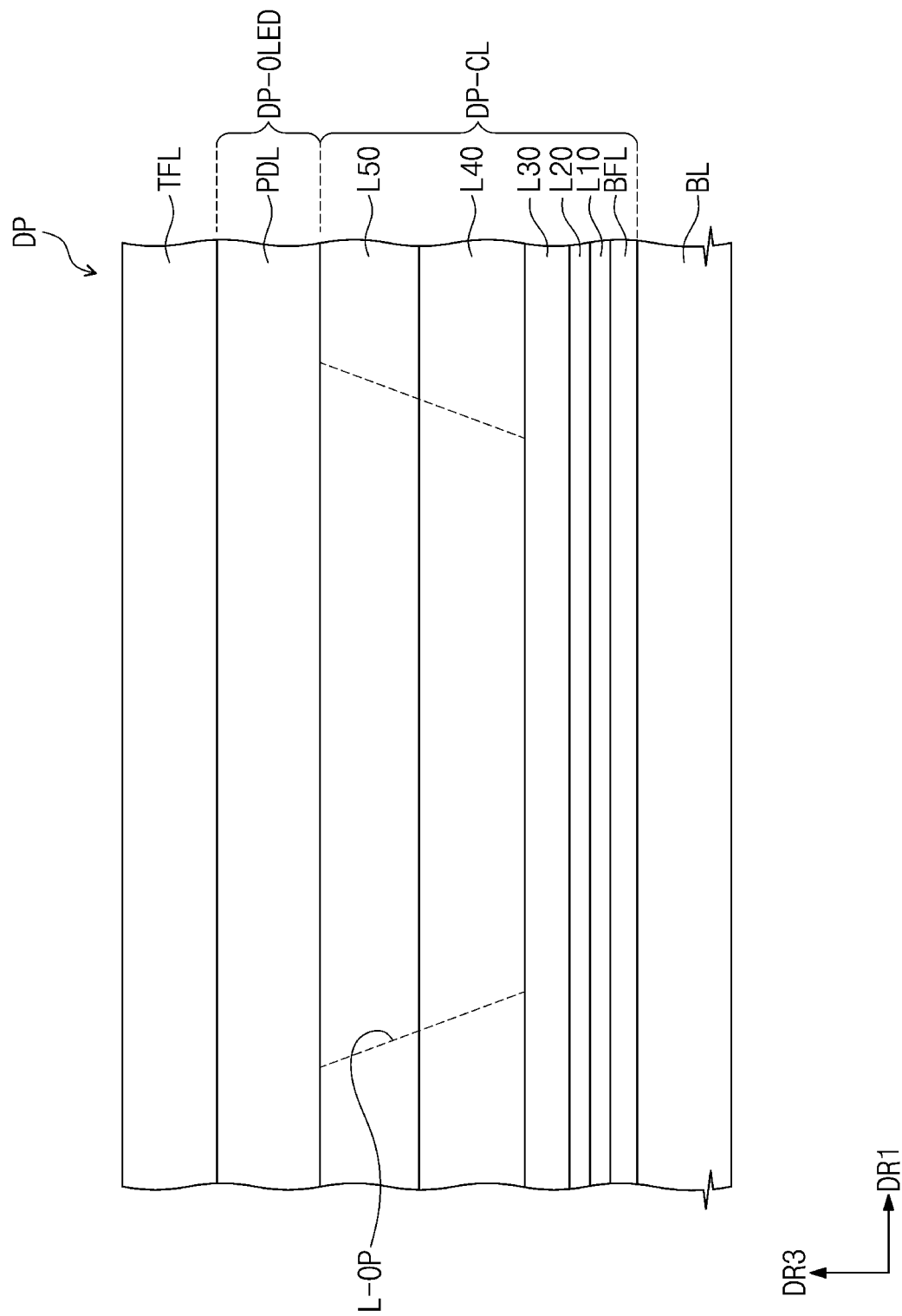

DISPLAY DEVICE AND ELECTRONIC DEVICE INCLUDING THE SAME

CROSS-REFERENCE TO RELATED APPLICATIONS

This U.S. non-provisional patent application claims priority under 35 U.S.C. § 119 to Korean Patent Application No. 10-2020-0081466, filed on Jul. 2, 2020, the disclosure of which is hereby incorporated by reference herein in its entirety.

TECHNICAL FIELD

The present inventive concept relates to a display device, and more particularly, to an electronic device having a display area through which an optical signal is transmitted.

DISCUSSION OF THE RELATED ART

In recent years, portable electronic devices has been widely distributed, and a function thereof has been more diversified. As portable electronic devices have been distributed, users have desired an electronic device having a wider display area and a narrower non-display area.

Various types of electronic devices has been under development to reduce the size of the non-display area.

SUMMARY

According to an embodiment of the present inventive concept, a display device including: a window; a polarizer disposed below the window and including an opening; a display panel disposed below the polarizer and including a first display area and a second display area that has a pixel density lower than that of the first display area, wherein the second display area overlaps the opening of the polarizer; and an optical controller overlapping the second display area and is disposed on the display panel, wherein the optical controller reduces a transmittance of an optical signal.

In an embodiment of the present inventive concept, the optical controller includes an electrochromic element.

In an embodiment of the present inventive concept, the optical controller includes a first electrode, a second electrode, a reduction discoloration material layer, an oxidation discoloration material layer and an electrolyte layer, wherein the reduction discoloration material layer and the oxidation discoloration material layer are disposed between the first electrode and the second electrode, and the electrolyte layer is disposed between the reduction discoloration material layer and the oxidation discoloration material layer.

In an embodiment of the present inventive concept, the optical controller includes a thin-film having a predetermined color, and the thin-film has substantially the same light transmittance as the polarizer.

In an embodiment of the present inventive concept, the optical controller includes a thin-film containing a dye or a pigment.

In an embodiment of the present inventive concept, each of the first display area and the second display area includes a plurality of unit pixel areas, and the number of the unit pixel areas per unit area in the second display area is less than that in the first display area.

In an embodiment of the present inventive concept, each of the plurality of unit pixel areas includes a first color light emitting area, a second color light emitting area, and a third color light emitting area, wherein the first color light emitting area, the second color light emitting area, and the third color light emitting area display different colors from one another.

In an embodiment of the present inventive concept, each of the plurality of unit pixel areas includes two second color light emitting areas.

In an embodiment of the present inventive concept, the first display area includes a plurality of first unit pixel areas. The second display area includes a plurality of second unit pixel areas and a plurality of non-unit pixel areas. Each of the plurality of second unit pixel areas includes a light emitting element disposed on an insulation layer, and each of the plurality of non-unit pixel areas includes an opening provided in an insulation layer.

In an embodiment of the present inventive concept, each of the plurality of first unit pixel areas and the plurality of second unit pixel areas includes at least three light emitting areas, and each of the non-unit pixel areas has an area greater than a sum of areas of at least two light emitting areas of the three light emitting areas.

In an embodiment of the present inventive concept, the optical controller is disposed on a top surface or a bottom surface of the window.

In an embodiment of the present inventive concept, the optical controller is disposed inside the opening of the polarizer.

In an embodiment of the present inventive concept, the display device further including an input sensor disposed between the display panel and the polarizer, wherein the optical controller is disposed on the input sensor.

In an embodiment of the present inventive concept, the first display area at least partially surrounds the second display area.

According to an embodiment of the present inventive concept, an electronic device including: a display device; and a camera module disposed below the display device, wherein the display device including: a window; an optical member disposed below the window and including an opening; a display panel including a first display area and a second display area, where a plurality of first unit pixel areas are disposed on the first display area, wherein a plurality of second unit pixel areas and a plurality of non-unit pixel areas are disposed on the second display area, wherein the second display area overlaps the opening of the polarizer; and an optical controller overlapping the second display area and disposed on the display panel, wherein the camera module overlaps the second display area.

In an embodiment of the present inventive concept, the optical controller includes an electrochromic element or a thin-film having a predetermined color.

In an embodiment of the present inventive concept, the optical member includes at least one of a polarizing film or a retarder film.

In an embodiment of the present inventive concept, the optical controller has substantially the same light transmittance as the polarizing film.

In an embodiment of the present inventive concept, the optical controller overlaps the camera module.

In an embodiment of the present inventive concept, the optical controller overlaps the opening of the polarizer.

BRIEF DESCRIPTION OF THE FIGURES

The above and other features of the present inventive concept will become more apparent by describing in detail embodiments thereof, with reference to the accompanying drawings, in which:

FIGS. 5D and 5E are cross-sectional views illustrating the display panel layer according to an embodiment of the present inventive concept;

DETAILED DESCRIPTION OF THE EMBODIMENTS

Figure 1:
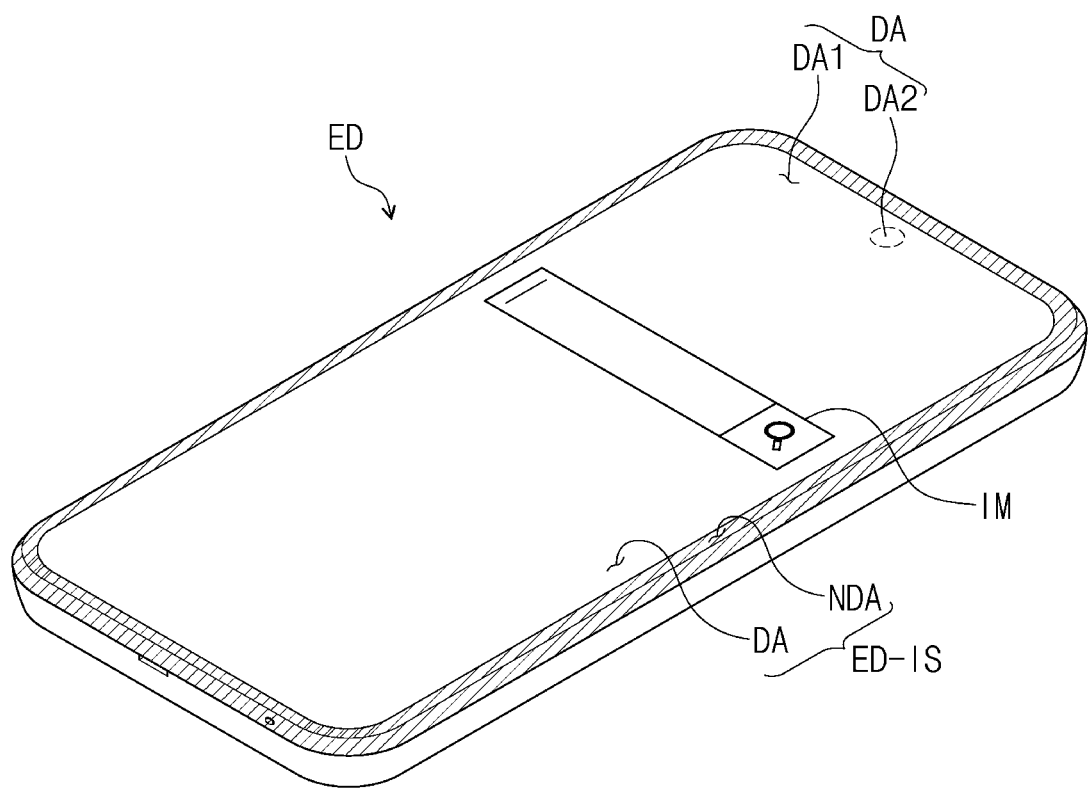
FIG. 1 is a perspective view illustrating an electronic device according to an embodiment of the present inventive concept.

Like reference numerals may refer to like elements throughout the specification. Also, in the figures, the thickness, ratio, and dimensions of components may be exaggerated for clarity. It will be understood that the term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the present inventive concept. The terms of a singular form may include plural forms unless referred to the contrary.

In addition, spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, in the example, terms "below" and "beneath" may encompass both an orientation of above, below and beneath. The device may be otherwise oriented (e.g., rotated 90 degrees or at other orientations) and the spatially relative descriptors used herein may be interpreted accordingly.

Figure 2:
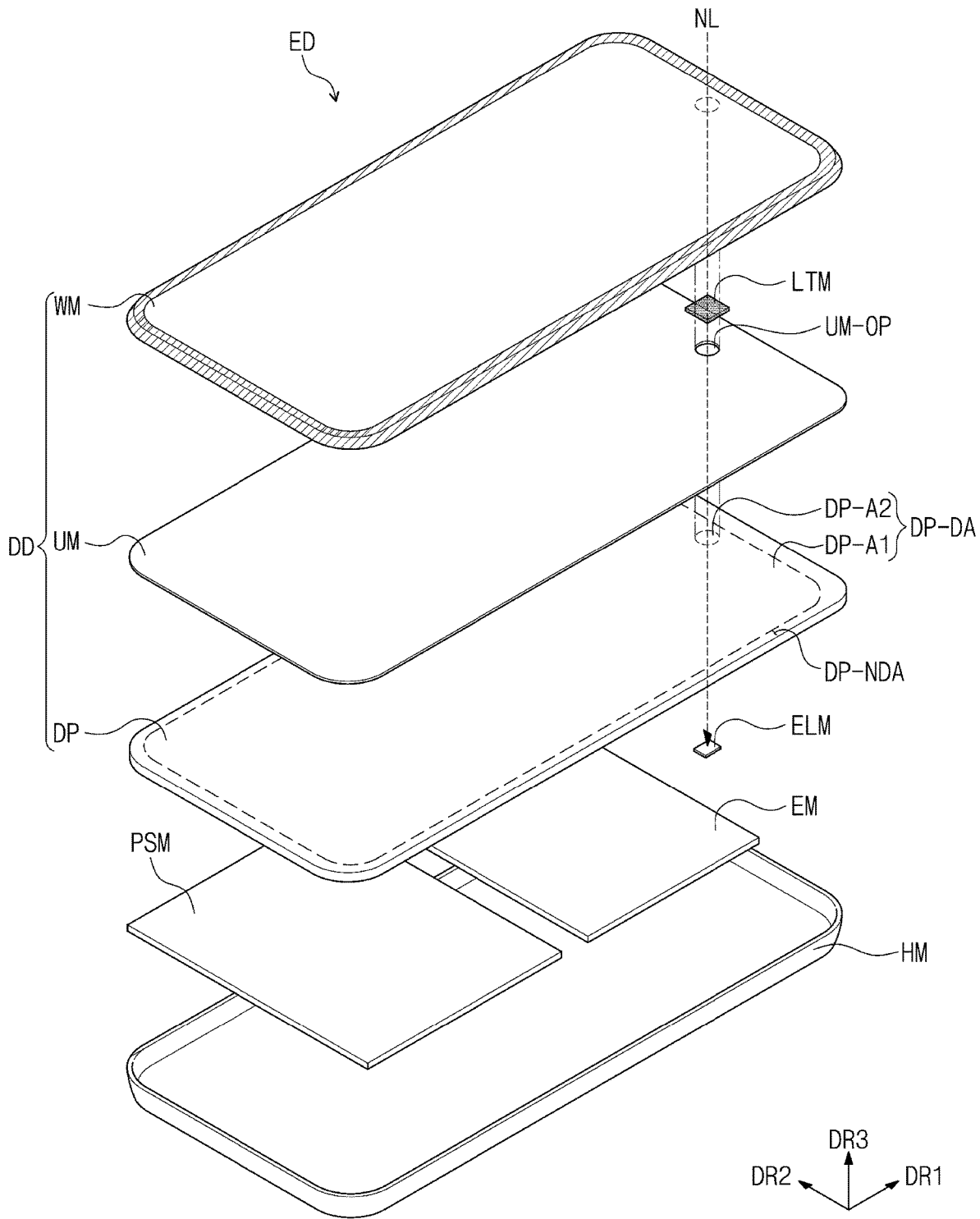
FIG. 2 is an exploded perspective view illustrating the electronic device according to an embodiment of the present inventive concept.
Figure 3:
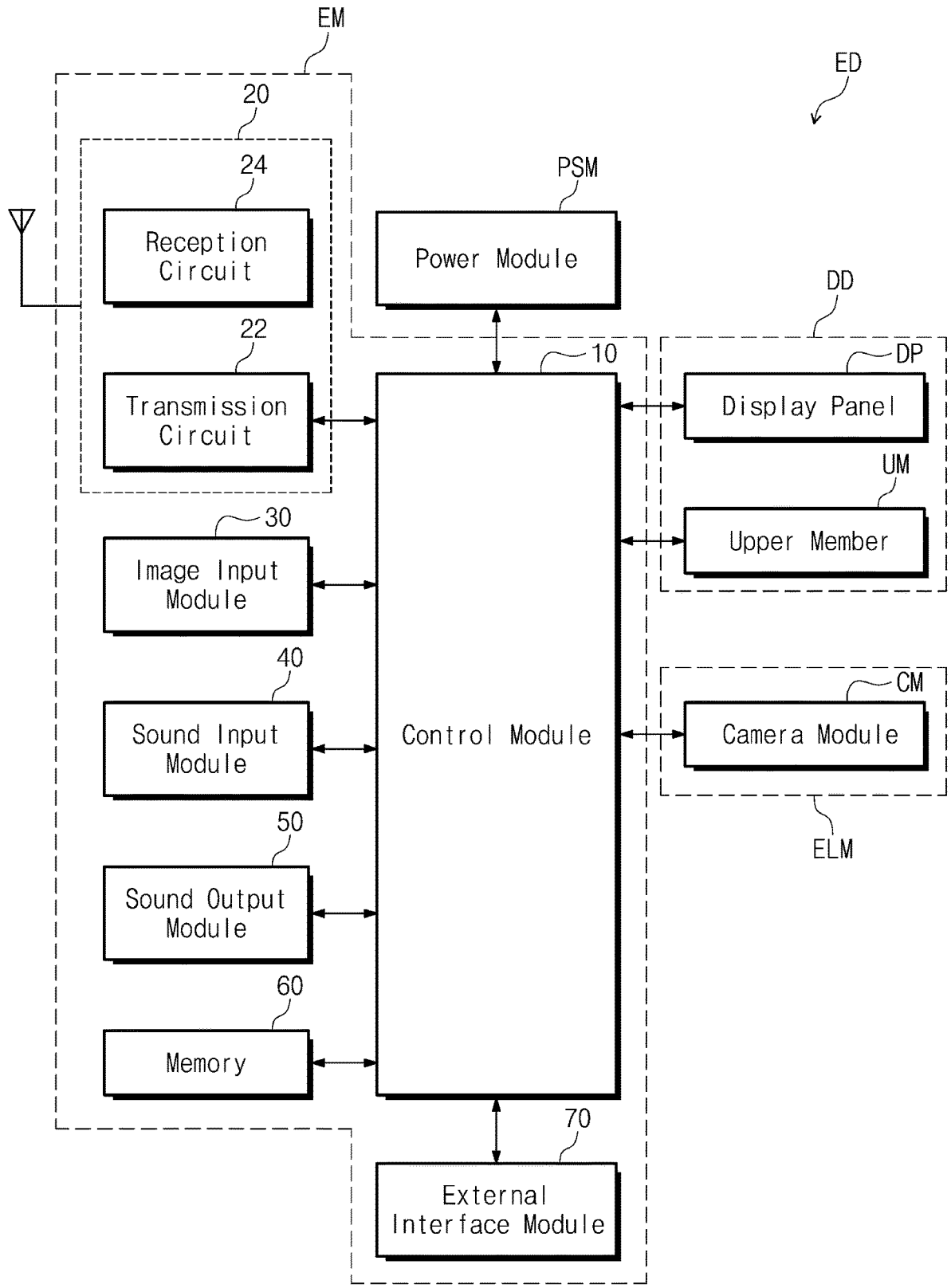
FIG. 3 is a block diagram representing the electronic device according to an embodiment of the present inventive concept.

FIG. 1 is a perspective view illustrating an electronic device ED according to an embodiment of the present inventive concept. FIG. 2 is an exploded perspective view illustrating the electronic device ED according to an embodiment of the present inventive concept FIG. 3 is a block diagram representing the electronic device ED according to an embodiment of the present inventive concept.

As illustrated in FIG. 1, the electronic device ED may display an image IM through a display surface ED-IS. The display surface ED-IS is parallel to a surface defined by a first directional axis DR1 and a second directional axis DR2. A normal direction of the display surface ED-IS, e.g., a thickness direction of the electronic device ED, indicates a third directional axis DR3. The display surface ED-IS of the electronic device ED may be a front surface of the electronic device ED and correspond to a top surface of a window WM.

Hereinafter, a front surface (or, e.g., a top surface) and a rear surface (or, e.g., a bottom surface) of each of members is distinguished by the third directional axis DR3. However, the first to third directional axes DR1, DR2, and DR3 illustrated in the embodiment are only exemplarily illustrated. Hereinafter, first to third directions may be directions indicated by the first to third directional axes DR1, DR2, and DR3 and designated by the same reference numerals, respectively.

The display surface ED-IS includes a display area DA and a non-display area NDA disposed adjacent to the display area DA. The non-display area NDA may be an area on which an image is not displayed. The display area DA includes a first display area DA1 and a second display area DA2. The second display area DA2 is an area having a low pixel density in comparison with the first display area DA1 and through which an optical signal is transmitted. Although one second display area DA2 is illustrated, more second display areas DA2 may be provided. Here, the optical signal may be external natural light or light generated from a light emitting element, e.g., infrared light. However, the present embodiment of the inventive concept is not limited to the kind of the optical signal. Detailed descriptions on the second display area DA2 will be described later.

The non-display area NDA may be an area blocking the optical signal and disposed outside the display area DA to at least partially surround the display area DA. In an embodiment of the present inventive concept, the non-display area NDA may be disposed on a side surface of the electronic device ED instead of the front surface. In an embodiment of the present inventive concept, the non-display area NDA may be omitted.

In the embodiment of the present inventive concept, the second display area DA2 may be surrounded by the first display area DAL. Although the second display area DA2 is spaced apart from the non-display area NDA in the present embodiment, the present inventive concept is not limited thereto. For example, the second display area DA2 may extend from the non-display area NDA.

Although the flat display surface ED-IS is illustrated in the present embodiment, the present inventive concept is not limited thereto. In an embodiment of the present inventive concept, curved areas may be disposed at both sides, which face each other in the second direction DR2, of the display surface ED-IS.

Although a mobile phone is illustrated, as an example, in the present embodiment, the present inventive concept is not limited thereto. For example, the electronic device according to an embodiment of the present inventive concept may include various display devices or various information providing devices such as a television, a navigation unit, a computer monitor, and a game console.

As illustrated in FIGS. 2 and 3, the electronic device ED may include a display device DD, an electronic module EM, an electronic optical module ELM, a power module PSM, and a housing HM.

The display device DD generates an image. The display device DD includes a display panel DP, an upper member UM, an optical controller LTM, and a window WM. In the display device DD, a first display area DP-A1, a second display area DP-A2, and a non-display area NDA, which correspond to the first display area DA1, the second display area DA2, and the non-display area NDA, respectively, are defined.

However, the present inventive concept is not limited to the display panel DP. For example, the display panel DP may include an organic light emitting display panel or a light emitting display panel such as a quantum dot light emitting display panel.

The display device DD may sense an external input and/or an external pressure according to a constitution of the upper member UM. The upper member UM may include various members.

In the present embodiment, the upper member UM may include an optical film and an input sensor. The optical film may reduce a reflectance of external light. The input sensor senses an external input of a user. The upper member UM may further include an adhesive layer coupling the optical film and the input sensor to each other.

The optical film may include, for example, a polarizer and a retarder. Each of the polarizer and the retarder may be an elongation-type or a coating-type. The coating-type optical film has an optical axis defined along an elongated direction of a functional film. The coating-type optical film may include liquid crystal molecules arranged on a base film. The input sensor may sense the external input with a capacitive method, a pressure sensitive method, or an electromagnetic induction method.

In the upper member UM, an opening UM-OP corresponding to the second display area DP-A2 of the display panel DP is provided. As the opening UM-OP is provided in the upper member UM, a black-out phenomenon or a defect such as a rainbow mura, which will be described later, may be prevented.

The optical controller LTM may be disposed to overlap the opening UM-OP of the upper member UM. The optical controller LTM compensates an optical signal transmittance, which is improved by the opening UM-OP of the upper member UM, into an optical signal transmittance corresponding to the upper member UM. The optical controller LTM reduces a transmittance or a reflective color sense of natural light of the opening UM-OP of the upper member UM to the substantially same level as those of natural light NL transmitted through the upper member UM so that the opening UM-OP of the upper member UM is not recognized from the outside.

Although the optical controller LTM disposed between the window WM and the upper member UM is illustrated in the present embodiment, a laminated position of the optical controller LTM may be changed.

The window WM provides an outer surface of the electronic device ED. The window WM may include a base substrate and functional layers such as an anti-reflection layer and an anti-fingerprint layer.

The display device DD may further include at least one adhesive layer. The adhesive layer may couple the window WM and the upper member UM to each other or the upper member UM and the display panel DP to each other. The adhesive layer may include an optically clear adhesive layer or a pressure sensitive adhesive layer.

The electronic module EM may include a control module 10, a wireless communication module 20, an image input module 30, a sound input module 40, a sound output module 50, a memory 60, and an external interface module 70. The above-described modules may be mounted to a circuit board or electrically connected through a flexible circuit board. The electronic module EM may be electrically connected to the power module PSM.

The control module 10 controls an overall operation of the electronic device ED. For example, the control module 10 activates or deactivates the display device DD in accordance with a user's input. The control module 10 may control the image input module 30, the sound input module 40, and the sound output module 50 in accordance with the user's input. The control module 10 may include at least one microprocessor.

The wireless communication module 20 may transceive a wireless signal with another terminal by using, for example, Bluetooth or WiFi link. The wireless communication module 20 may use a general communication line to transceive a voice signal. The wireless communication module 20 includes a transmission circuit 22 and a reception circuit 24. The transmission circuit 22 modulates a signal to be transmitted and transmits the modulated signal, and the reception circuit 24 demodulates a received signal.

The image input module 30 processes an image signal to convert the image signal into image data that is displayable in the display device DD. The sound input module 40 receives an external sound signal through a microphone in a recording mode or a voice recognition mode to convert the received external sound signal into electrical voice data. The sound output module 50 converts sound data received from the wireless communication module 20 or sound data stored in the memory 60 to output the converted sound data to the outside.

The external interface module 70 serves as an interface connected to an external charger, a wire/wireless data port, or a card socket (e.g., a memory card socket and a SIM/UIM card socket).

The power module PSM supplies power for the overall operation of the electronic device ED. The power module PSM may include a typical battery device.

The housing HM in FIG. 2 is coupled with the display device DD, for example, the window WM, to accommodate the above-described other modules. In FIG. 2, the housing HM constituted by one member is illustrated. However, the housing HM may include two or more components that are assembled with each other.

The electronic optical module ELM may be an electronic component that outputs or receives an optical signal. The electronic optical module ELM transmits the optical signal through a partial area of the display device DD corresponding to the second display area DP-A2. In the present embodiment, the electronic optical module ELM may include a camera module CM. The camera module CM photographs an external image by receiving the natural light NL through the second display area DP-A2. The electronic optical module ELM may include a proximity sensor or an infrared light emitting sensor.

As described above, an opening is defined in a polarizer and a retarder in an area through which the natural light received by the camera module DM passes. The camera module CM may receive the natural light that is not polarized or retarded. The black-out phenomenon and the rainbow mura will be described assuming that the camera module CM photographs an image broadcasted in a television. The television includes at least one of the polarizer and the retarder. The image broadcasted in the television may be a polarized image or a retarded image. As optical interference is generated between the polarizer or the retarder of the television and the polarizer or the retarder of the electronic device with the camera module mounted, resultantly, the black-out phenomenon or the rainbow mura may be generated. According to the present embodiment, as the opening is defined in the polarizer and the retarder, the above-described phenomenon may be prevented. When an image provided from the television, only the polarized image or the retarded image is photographed, and the optical interference is not generated in the above-described image.

The electronic optical module ELM is disposed below the display device DD. The electronic optical module ELM overlaps the second display area DP-A2 of the display device DD. The second display area DP-A2 of the display device DD may have a greater light transmittance than other areas of the display device DD. Hereinafter, the display device DD will be described in more detail.

Figure 4A:
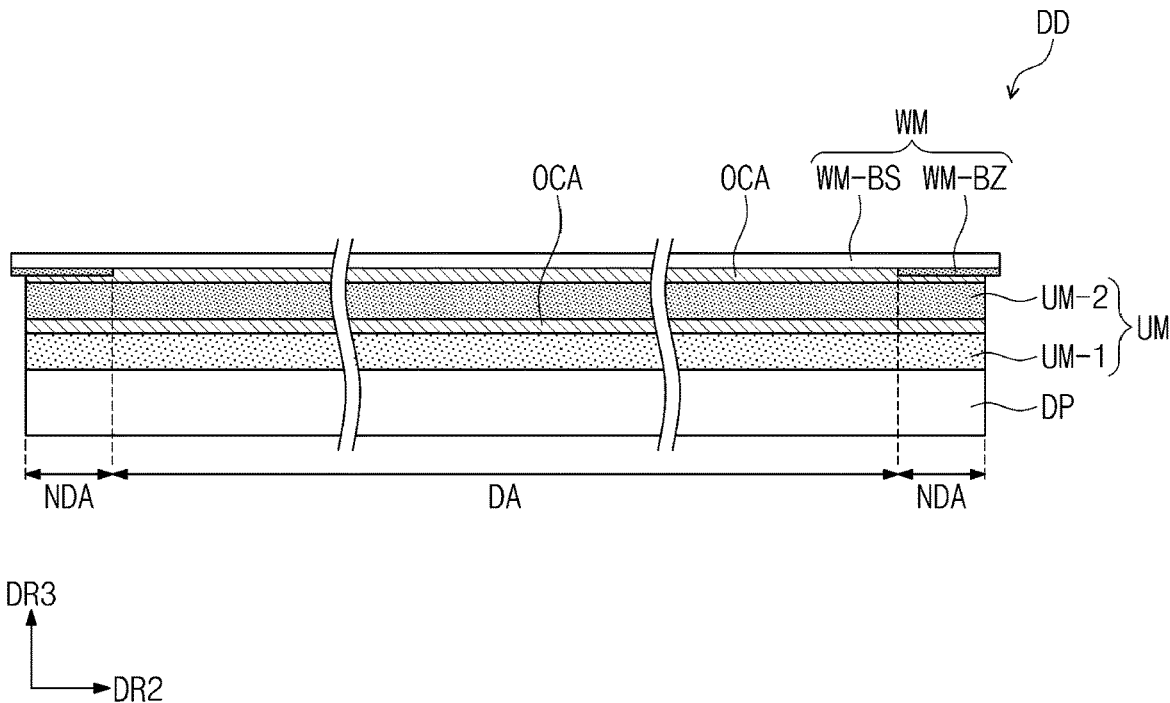
FIGS. 4A and 4B are cross-sectional views illustrating a display device according to an embodiment of the present inventive concept.
Figure 4B:
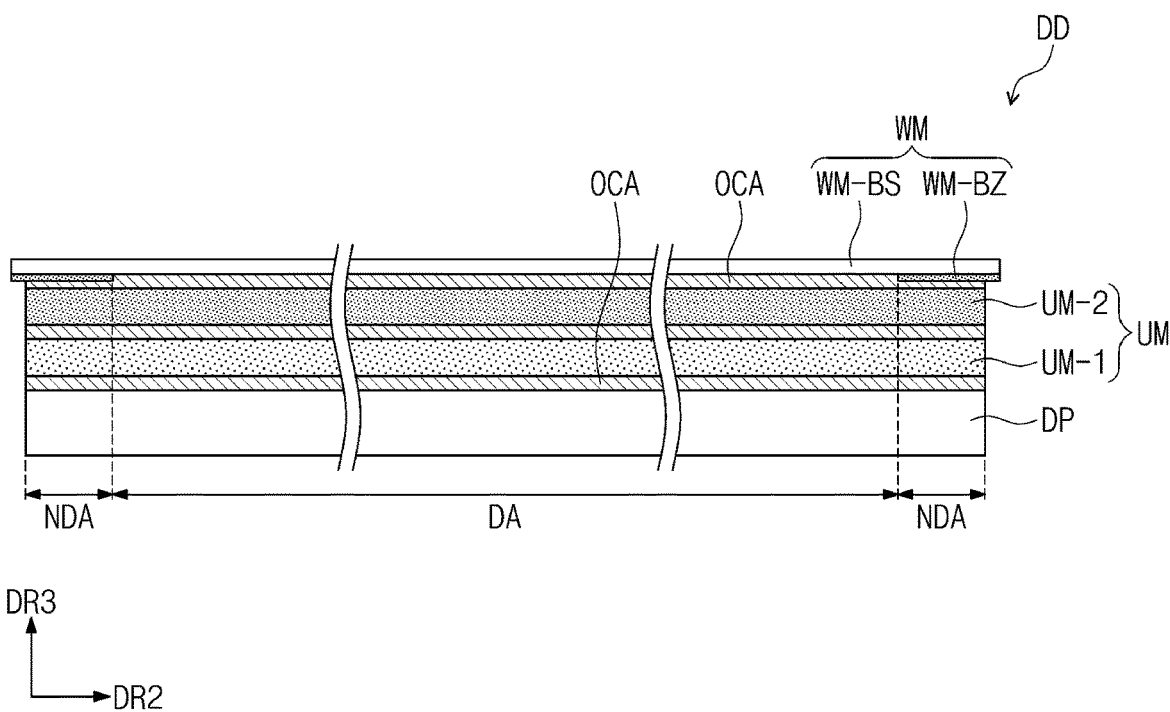

FIGS. 4A and 4B are cross-sectional views illustrating the display device DD according to an embodiment of the present inventive concept. Hereinafter, detailed descriptions on the same component as that described with reference to FIGS. 1 to 3 will be omitted.

As illustrated in FIGS. 4A and 4B, the display device DD includes the display panel DP, the upper member UM, and the window WM. The upper member UM includes an input sensor UM-1 and an optical member UM-2. As illustrated in FIGS. 4A and 4B, the window WM and the optical member UM-2 may be coupled to each other through an adhesive layer OCA, and the optical member UM-2 and the input sensor UM-1 may be coupled to each other through an adhesive layer OCA.

As illustrated in FIGS. 4A and 4B, the window WM may include a base substrate WM-BS and a bezel pattern WM-BZ. The base substrate WM-BS includes a transparent base layer such as a glass substrate or a transparent film. For example, the bezel pattern WM-BZ may have a multilayer structure. The multilayer structure may include a colored color layer (e.g., a color filter layer) and a black light shielding layer. For example, the colored color layer and the black light shielding layer may be provided through a deposition, printing, or coating process. The bezel pattern WM-BZ may be omitted from the window WM and provided to the upper member UM instead of the base substrate W M-BS. For example, the bezel pattern WM-BZ may be provided on the upper member UM.

The optical member UM-2 may have a multilayer structure including an adhesive layer. For example, the optical member UM-2 may include at least a polarizing film. For example, optical member UM-2 may include at least a retarder film.

The input sensor UM-1 in FIG. 4A may be disposed on the display panel DP. For example, the input sensor UM-1 may be directly disposed on a base surface of the display panel DP. In this specification, an expression "B component is directly disposed on A component" represents that an additional adhesive or sticking layer is not disposed between A component and B component. The B component may be formed on a base surface provided by the A component through a continuous process after the A component is formed.

As illustrated in FIG. 4B, the input sensor UM-1 may be separately manufactured and then coupled to the display panel DP. The adhesive layer OCA may be disposed between the input sensor UM-1 and the display panel DP.

Figure 5A:
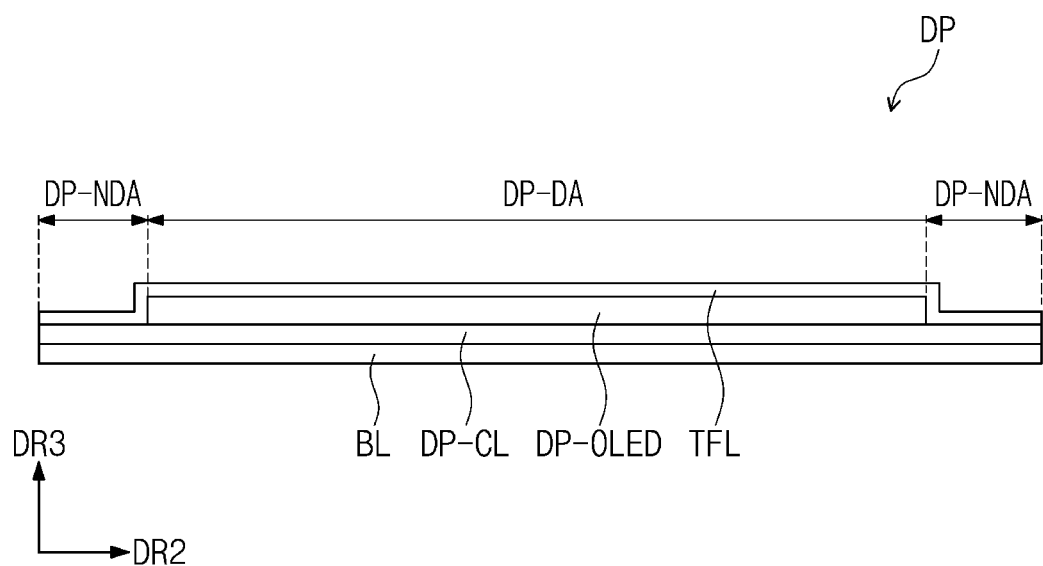
FIG. 5A is a cross-sectional view illustrating a display panel according to an embodiment of the present inventive concept.
Figure 5B:
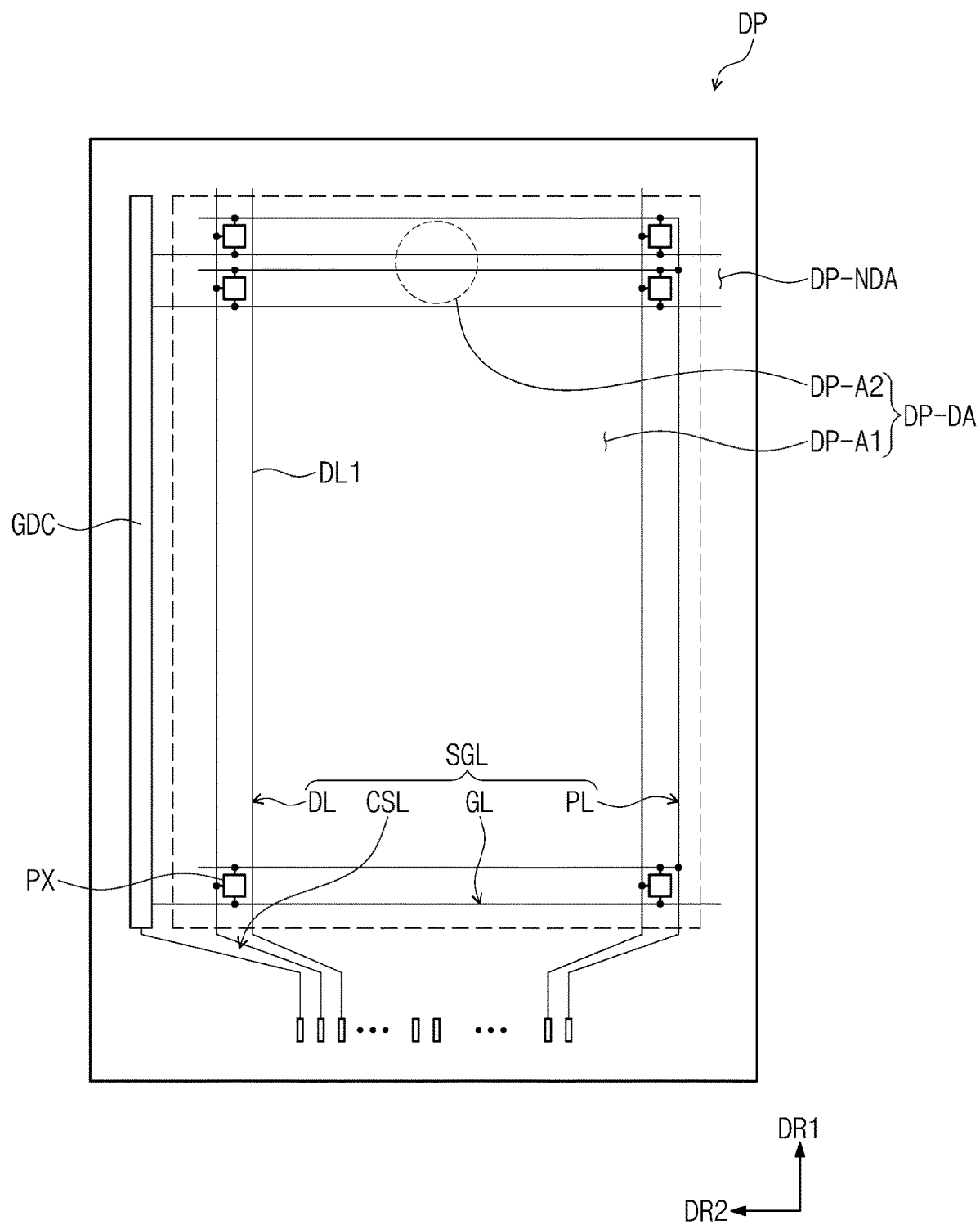
FIG. 5B is a plan view illustrating the display panel according to an embodiment of the present inventive concept.
Figure 5C:
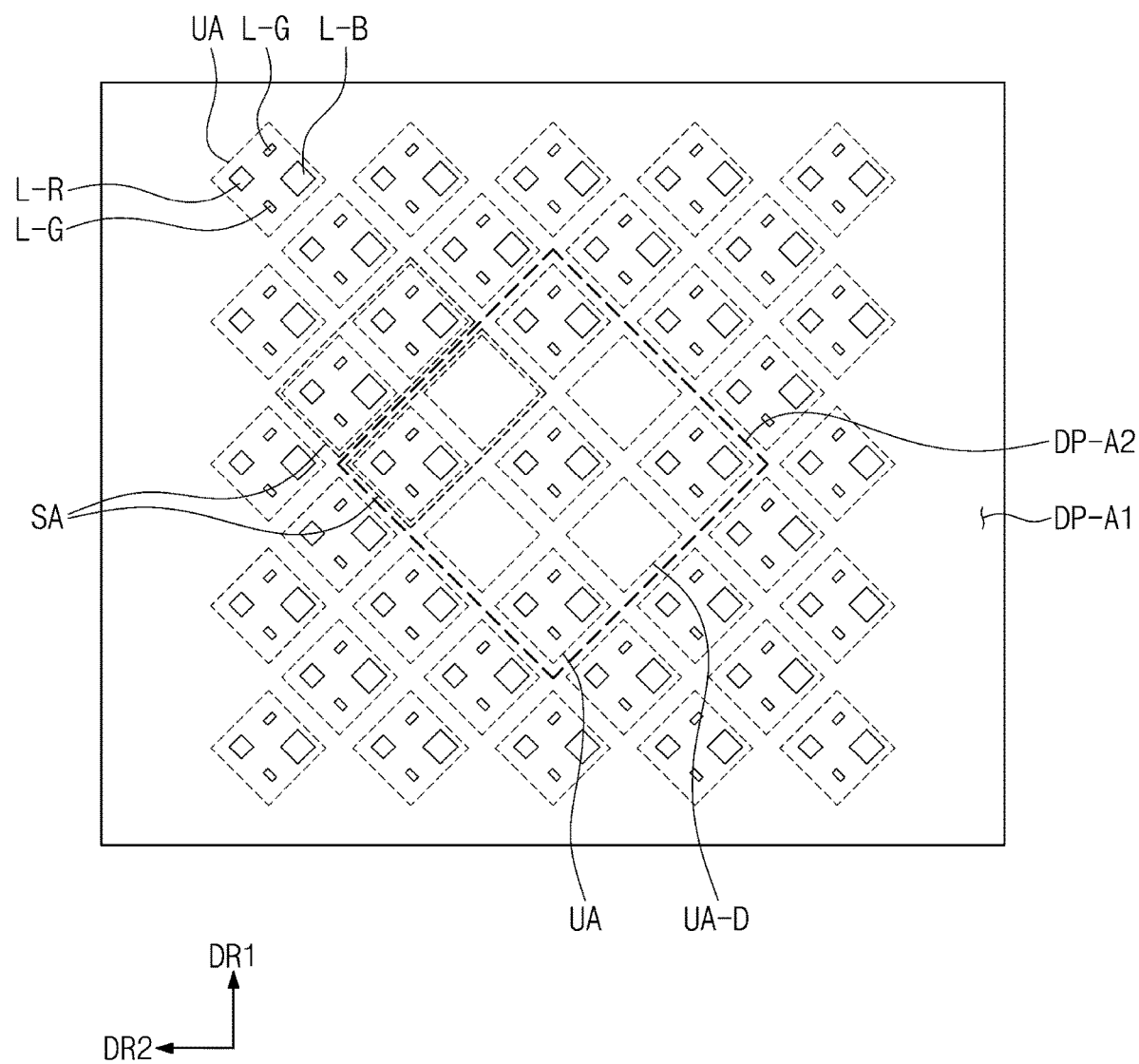
FIG. 5C is an enlarged plan view illustrating the display panel according to an embodiment of the present inventive concept.
Figure 5D:
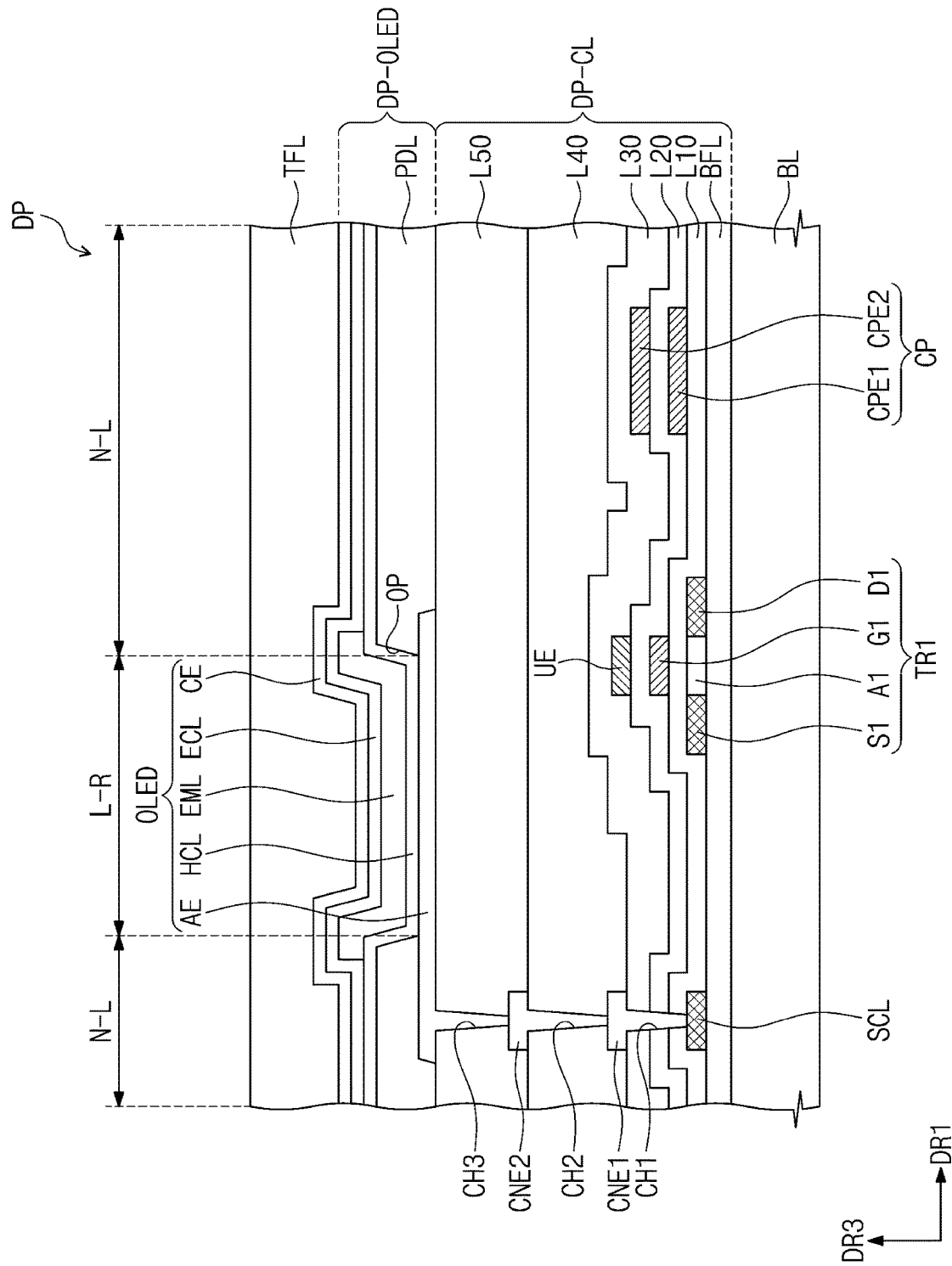

FIG. 5A is a cross-sectional view illustrating the display panel DP according to an embodiment of the present inventive concept. FIG. 5B is a plan view illustrating the display panel DP according to an embodiment of the present inventive concept. FIG. 5C is an enlarged plan view illustrating the display panel DP according to an embodiment of the present inventive concept. FIGS. 5D and 5E are cross-sectional views illustrating the display panel DP according to an embodiment of the present inventive concept.

As illustrated in FIG. 5A, the display panel DP includes a base layer BL, a circuit element layer DP-CL disposed on the base layer BL, a display element layer DP-OLED, and an upper insulation layer TFL. The base layer BL may include, for example, a plastic substrate, a glass substrate, a metal substrate, and an organic/inorganic composite substrate. The base layer BL may include at least one polyimide layer.

The circuit element layer DP-CL includes, for example, at least one insulation layer, semiconductor patterns, and conductive patterns. The insulation layer includes at least one inorganic layer and at least one organic layer. The semiconductor patterns and the conductive patterns may constitute signal lines, a pixel driving circuit, and a scan driving circuit. Detailed descriptions on this will be described later.

The display element layer DP-OLED may include a display element, e.g., an organic light emitting diode. The display element layer DP-OLED may further include an organic layer such as a pixel defining layer.

For example, the upper insulation layer TFL includes a plurality of thin-films. Some of the thin-films are disposed to increase an optical efficiency, and some are disposed to protect the organic light emitting diodes. The upper insulation layer TFL may further include a thin-film encapsulation layer including a laminated structure including an inorganic layer, an organic layer, and an inorganic layer sequentially disposed.

As illustrated in FIG. 5B, the display panel DP may include a plurality of signal lines SGL (hereinafter, referred to as signal lines), a plurality of pixels PX (hereinafter, referred to as pixels), and a driving circuit GDC. The pixels PX are disposed on the display area DP-DA. Each of the pixels PX includes an organic light emitting diode and a pixel driving circuit connected thereto. The signal lines SGL and the pixel driving circuit may be contained in the circuit element layer DP-CL in FIG. 5A.

The second display area DP-A2 may have a lower pixel density than the first display area DP-A1. Less pixels PX may be disposed on the second display area DP-A2 than the first display area DP-A1 with respect to the same sized area. An area on which the pixels PX are not disposed corresponds to a transmission area of the optical signal.

The pixels PX are not disposed on the non-display area DP-NDA. The driving circuit GDC is disposed on the non-display area DP-NDA. In the present embodiment, the driving circuit GDC may include a scan driving circuit. The scan driving circuit generates a plurality of scan signals (hereinafter, referred to as scan signals) and sequentially outputs the scanning signals to a plurality of scan lines GL (hereinafter, referred to as scan lines) that will be described later. The scan driving circuit may further output another control signal to the driving circuit of the pixels PX.

The scan driving circuit may include a plurality of thin-film transistors that are provided through the same process as the driving circuit of the pixels PX, e.g., a low temperature polycrystalline silicon (LTPS) process or a low temperature polycrystalline oxide (LTPO) process.

The signal lines SGL includes scan lines GL, data lines DL, a power line PL, and a control signal line CSL. The signal lines SGL may further include separate reset lines and light emitting lines. Each of the scan lines GL is connected to a corresponding pixel PX of the pixels PX, and each of the data lines DL is connected to a corresponding pixel PX of the pixels PX. The power line PL is connected to the pixels PX. The control signal line CSL may provide control signals to the scan driving circuit.

The signal lines SGL may be connected to a circuit board. For example, the signal lines SGL may be connected to an integrated chip type timing control circuit that is mounted to the circuit board.

As illustrated in FIG. 5C, three kinds of pixels may be disposed on each of the first display area DP-A1 and the second display area DP-A2. The three kinds of pixels generating light having different colors may be defined as a first color pixel, a second color pixel, and a third color pixel. Each of the three kinds of pixels may include a pixel driving circuit and a light emitting element.

In FIG. 5C, light emitting areas L-R, L-G, and L-B of the light emitting elements are illustrated. A first light emitting area L-R is a light emitting area of the first color pixel, a second light emitting area L-G is a light emitting area of the second color pixel, and a third light emitting area L-B is a light emitting area of the third color pixel.

The first display area DP-A1 includes a plurality of unit pixel areas UA (which is a first unit pixel area). The plurality of unit pixel areas UA may have the same light emitting area arrangement as each other. Each of the plurality of unit pixel areas UA includes the first light emitting area L-R, the second light emitting area L-G, and the third light emitting area L-B. In the present embodiment, each of the plurality of unit pixel areas UA includes one first light emitting area L-R, two second light emitting areas L-G, and one third light emitting area L-B. The two second light emitting areas L-G face each other in the first direction, and the first light emitting area L-R faces the third light emitting area L-B in the second direction DR2.

One of the two second light emitting areas L-G may be a fourth light emitting area that is distinguished from the second light emitting area L-G. As illustrated in FIG. 5C, the second light emitting area L-G and the fourth light emitting area may have different planar shapes. However, the present inventive concept is not limited to the number and kind of the light emitting areas contained in the plurality of unit pixel areas UA.

In the present embodiment, the one first light emitting area L-R may generate red light. Each of the two second light emitting areas L-G may generate green light. The one third light emitting area L-B may generate blue light. The red light, the green light, and the blue light may be changed into other three primary colors.

A plurality of unit pixel areas UA (which is a second unit pixel area) may be also disposed on the second display area DP-A2. Here, the number of light emitting areas per unit area SA in the second display area DP-A2 is less than that in the first display area DP-A1. As illustrated in FIG. 5C, the number of unit pixel areas disposed per unit area SA in the second display area DP-A2 may be less than that in the first display area DP-A1. The pixel density may be inferred by comparing the number of light emitting areas or the number of unit pixel areas.

In an embodiment of the present inventive concept, the first display area DP-A1 and the second display area DP-A2 may have different repeating units. For example, the unit pixel areas of the second display area DP-A2 may have a different arrangement from those of the first display area DP-A1.

As illustrated in FIG. 5C, a plurality of non-unit pixel areas UA-D may be disposed on the second display area DP-A2. The pixels are not disposed on each of the non-unit pixel areas UA-D. At least the light emitting element is not disposed on the non-unit pixel area UA-D. Substantially, the optical signal may move through the non-unit pixel area UA-D.

The non-unit pixel area UA-D may have an area corresponding to that of the unit pixel area UA. For example, the size of the non-unit pixel area UA-D may be substantially the same as that of the unit pixel area UA. In addition, the non-unit pixel area UA-D may not have the same area as the unit pixel area UA. When the unit pixel area UA includes at least three light emitting areas L-R, L-G, and L-B as described above, the non-unit pixel area UA-D may have an area greater than a sum of areas of at least two light emitting areas among the three light emitting areas L-R, L-G, and L-B.

FIG. 5D illustrates a cross-section of the display panel DP corresponding to the first light emitting area L-R of the light emitting areas L-R, L-G, and L-B. FIG. 5D illustrates a cross-section of an organic light emitting diode OLED corresponding to the light emitting element and one transistor TR1 of the pixel driving circuit.

The transistor TR1 and the organic light emitting diode OLED are disposed on the base layer BL. The base layer BL may include a synthetic resin layer. The circuit element layer DP-CL is disposed on the base layer BL.

In the present embodiment, the circuit element layer DP-CL may include a buffer layer BFL, a first intermediate inorganic layer L10, a second intermediate inorganic layer L20, and a third intermediate inorganic layer L30, which are inorganic layers, and may further include a first intermediate organic layer L40 and a second intermediate organic layer L50, which are organic layers.

The semiconductor pattern is disposed on the buffer layer BFL. The semiconductor pattern may include a silicon semiconductor. In addition, the semiconductor pattern may include polysilicon. However, the embodiment of the inventive concept is not limited thereto. For example, the semiconductor pattern may include amorphous silicon. The semiconductor pattern may include a metal oxide semiconductor.

The semiconductor pattern has an electrical property that is different according to whether doped or not. The semiconductor pattern may include a doped area and a non-doped area. The doped area may be doped with a n-type dopant or a p-type dopant. A p-type transistor includes a doped area that is doped with the p-type dopant.

The doped area has a conductivity greater than that of the non-doped area and substantially serve as an electrode or a signal line. The non-doped area substantially corresponds to an active (or, e.g., a channel) of the transistor. In other words, one portion of the semiconductor pattern may be the active (or, e.g., the channel) of the transistor, another portion may be a source (or, e.g., an input electrode region) or a drain (or, e.g., an output electrode region) of the transistor, and another portion may be a transmission signal line (or, e.g., a transmission region).

As illustrated in FIG. 5D, a source SI, an active A1, and a drain DI of the transistor TR1 may be provided from the semiconductor pattern. A portion of a transmission signal line SCL provided from the semiconductor pattern is illustrated. The transmission signal line SCL may be connected to another transistor (e.g., a driving transistor) constituting the pixel driving circuit on a plane.

A control electrode G1 is disposed on the first intermediate inorganic layer L10 to overlap the active A1. A first capacitor electrode CPE1 of a capacitor CP is disposed on the first intermediate inorganic layer L10. A second capacitor electrode CPE2 of the capacitor CP is disposed on the second intermediate inorganic layer L20. An upper electrode UE overlapping the control electrode GE is disposed on the second intermediate inorganic layer L20.

A first connection electrode CNE1 may be disposed on the third intermediate inorganic layer L30. The first connection electrode CNE1 may be connected to the transmission signal line SCL through a first through-hole CH1. A second connection electrode CNE2 may be disposed on the first intermediate organic layer L40. The second connection electrode CNE2 may be connected to the first connection electrode CNE1 through a second through-hole CH2. Conductive patterns different from the first connection electrode CNE1 may be disposed on the third intermediate inorganic layer L30, and conductive patterns different from the second connection electrode CNE2 may be disposed on the first intermediate organic layer L40. The above-described conductive patterns may constitute a signal line, e.g., a data line DL (refer to FIG. 5B).

A first electrode AE is disposed on the second intermediate organic layer L50. The first electrode AE may be connected to the second connection electrode CNE2 through a third through-hole CH3. A light emitting opening OP is formed in a pixel defining layer PDL. The light emitting opening OP of the pixel defining layer PDL exposes at least a portion of the first electrode AE.

The display area DP-DA may include a light emitting area L-R and a non-light emitting area N-L disposed adjacent to the light emitting area L-R. The non-light emitting area N-L may surround the light emitting area L-R. In the present embodiment, the light emitting area L-R corresponds to a partial area of the first electrode AE, which is exposed by the light emitting opening OP.

A hole control layer HCL may be disposed in the light emitting area I-R and the non-light emitting area N-L in common. The hole control layer HCL may include a hole transport layer and a hole injection layer. A light emitting layer EML is disposed on the hole control layer HCL. The light emitting layer EM L may be disposed on an area corresponding to the light emitting opening OP. For example, the light emitting layer EML may be separately provided in each of the pixels. The light emitting layer EML may include an organic material and/or an inorganic material. The light emitting layer EML may generate colored light having a predetermined color.

An electron control layer ECL is disposed on the light emitting layer EML. The electron control layer ECL may include an electron transport layer and an electron injection layer. The hole control layer HCL and the electron control layer ECL may be provided in common to the plurality of pixels by using an open mask. A second electrode CE is disposed on the electron control layer ECL. The second electrode CE is disposed in common to the plurality of pixels. An upper insulation layer TFL is disposed on the second electrode CE. The upper insulation layer TFL may include a plurality of thin-films. The plurality of thin-films may include an organic film and/or an inorganic film.

FIG. 5E illustrates a cross-section of the display panel DP corresponding to the non-unit pixel area UA-D. Unlike the cross-section corresponding to the first light emitting area L-R, only the insulation layer is disposed in the non-unit pixel area UA-D, and the semiconductor patterns and the conductive patterns are not disposed therein. The semiconductor patterns and the conductive patterns are omitted from the non-unit pixel area UA-D because the semiconductor patterns and the conductive patterns interrupt the transmission of the optical signal.

As illustrated by a dotted line in FIG. 5E, an opening L-OP may be provided in the non-unit pixel area UA-D of the insulation layers L-40 and L-50 among the insulation layers. The pixel defining layer PDL and the upper insulation layer TFL are filled in the opening L-OP, and the corresponding area may have a smaller insulation layer thickness than other areas in the non-unit pixel area UA-D. As a thickness of the insulation layer corresponding to the non-unit pixel area UA-D is reduced, the transmittance of the optical signal may increase.

Figure 6A:
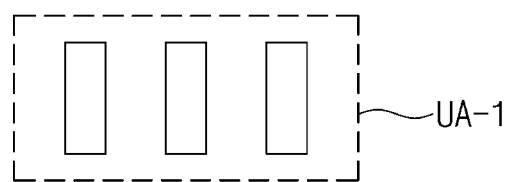
FIGS. 6A and 6B are plan views illustrating a unit pixel area according to an embodiment of the present inventive concept.
Figure 6B:
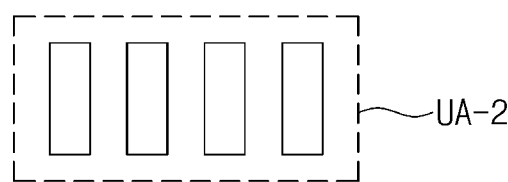

FIGS. 6A and 6B are plan views illustrating a unit pixel area UA-1 and UA-2 according to an embodiment of the present inventive concept.

The unit pixel area UA-1 and UA-2 in FIGS. 6A and 6B may be disposed on only the second display area DP-A2 described with reference to FIGS. 5A to 5E or disposed on the first display area DP-A1 and the second display area DP-A2 in common.

As illustrated in FIG. 6A, the unit pixel area UA-1 may include one first light emitting area L-R, one second light emitting area L-G, and one third light emitting area L-B. The first light emitting area L-R, the second light emitting area L-G, and the third light emitting area L-B of the unit pixel area UA-1 may be arranged in a stripe shape. For example, first light emitting area L-R, the second light emitting area L-G, and the third light emitting area L-B may be arranged in a direction parallel to a long side of the unit pixel area UA-1. Although the first light emitting area L-R, the second light emitting area L-G, and the third light emitting area L-B of the unit pixel area UA-1 may have the same area as each other, the present inventive concept is not limited thereto.

As illustrated in FIG. 6B, the unit pixel area UA-2 may include one first light emitting area L-R, two second light emitting areas L-G, and one third light emitting area L-B. The first light emitting area L-R, the second light emitting area L-G, and the third light emitting area L-B of the unit pixel area UA-2 may provide a pentile-type arrangement that is arranged in one direction.

In an embodiment of the present inventive concept, the first light emitting area L-R, the second light emitting area L-G, and the third light emitting area L-B of the unit pixel area UA-2 may have different areas from each other. One of the two second light emitting areas L-G of the unit pixel area UA-2 may be replaced by the fourth light emitting area generating light having a color different from the second light emitting area L-G. For example, the fourth light emitting area may generate white light.

Figure 7A:
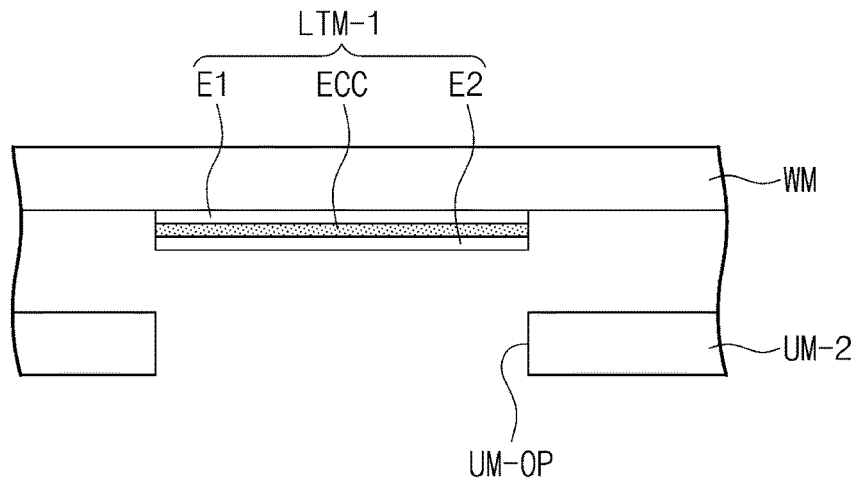
FIGS. 7A, 7B and 7C are cross-sectional views illustrating an optical controller according to an embodiment of the present inventive concept.
Figure 7B:
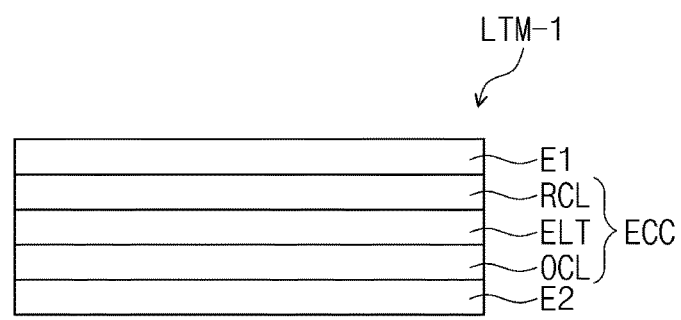
Figure 7C:
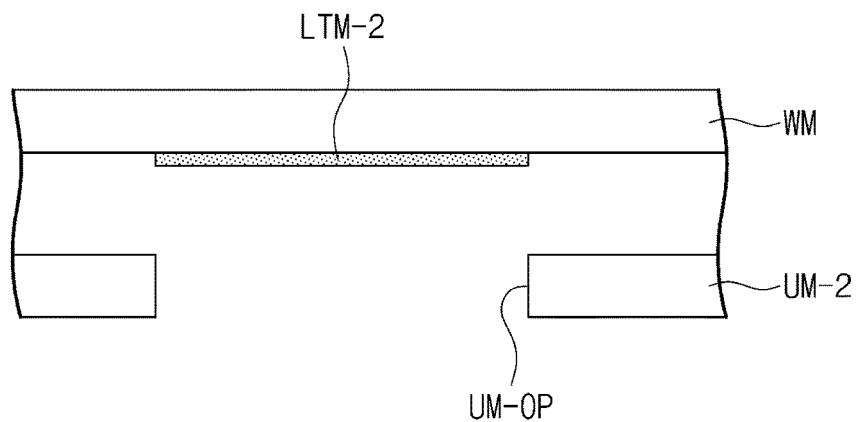

FIGS. 7A to 7C are cross-sectional views illustrating the optical controller LTM according to an embodiment of the present inventive concept. FIGS. 7A to 7C illustrate, as an example, an optical controller LTM-1 and LTM-2 disposed on the window WM. For example, the optical controller LTM-1 and LTM-2 may be disposed directly on a bottom surface of the window WM.

The optical controller LTM-1 and LTM-2 overlaps the opening UM-OP of the optical member UM-2. The optical member UM-2 may include a polarizing film, a retarder film, or a laminated structure of the polarizing film and the retarder film. The optical controller LTM-1 and LTM-2 may reduce a transmittance of natural light or change a reflective color sense of natural light so that the opening UM-OP of the optical member UM-2 is not recognized from the outside.

As illustrated in FIGS. 7A and 7B, the optical controller LTM-1 and LTM-2 may include an electrochromic element LTM-1. The electrochromic element LTM-1 may be changed in color by an electrochemical reaction, and a transmittance of the optical signal may be varied according to the color.

The electrochromic element LTM-1 includes a first electrode E1, a second electrode E2, and an electrochromic layer ECC disposed therebetween. In the present embodiment, the electrochromic layer ECC includes a reduction discoloration material layer RCL, an oxidation discoloration material layer OCL, and an electrolyte layer ELT disposed therebetween.

Each of the first electrode E1 and the second electrode E2 includes a transparent conductive material. An electrical signal applied to the first electrode E1 and the second electrode E2 may be controlled by the above-described control module 10 (refer to FIG. 3). The reduction discoloration material layer RCL may include, for example, Ti, Ca, Nb, Mo, Ta, and W, and the oxidation discoloration material layer OCL may include, for example, V, Cr, Mn, Fe, Co, Ni, Rh, and Ir. In an embodiment of the present inventive concept, one of the reduction discoloration material layer RCL and the oxidation discoloration material layer OCL may be omitted. The electrochromic element LTM-1 may further include an encapsulation structure that seals the above-described components of the electrochromic element LTM-1.

As illustrated in FIG. 7C, the optical controller LTM-1 and LTM-2 may include a thin-film having a predetermined color. The thin-film may include, for example, a dye and a pigment. The reflective color sense and the transmittance of the optical signal and may be determined according to a color or a composition of the dye or the pigment. The thin-film may substantially have the same light transmittance as the polarizer. For example, the dye or the pigment may be deposited or applied by the sputtering method. The thin-film may further include a binder.

Figure 8A:
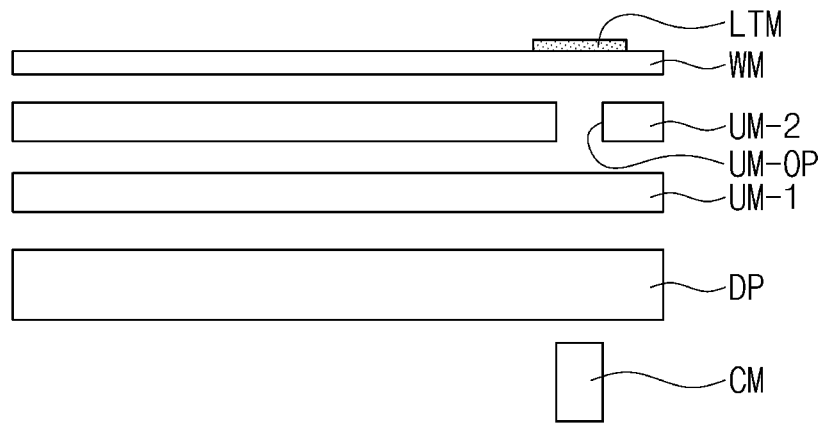
FIGS. 8A, 8B and 8C are cross-sectional views illustrating the display device according to an embodiment of the present inventive concept.
Figure 8B:
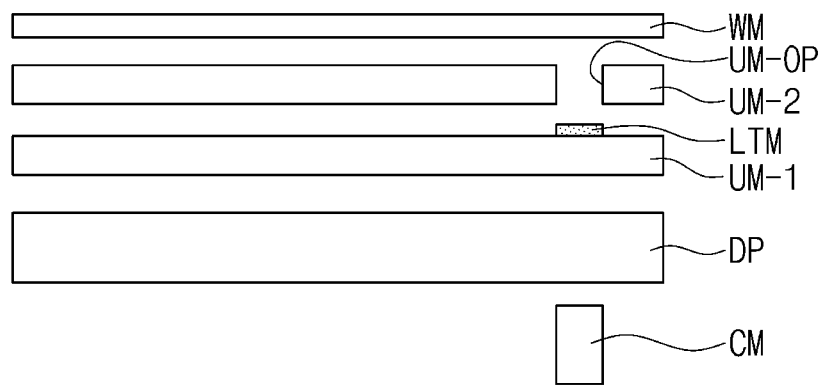
Figure 8C:
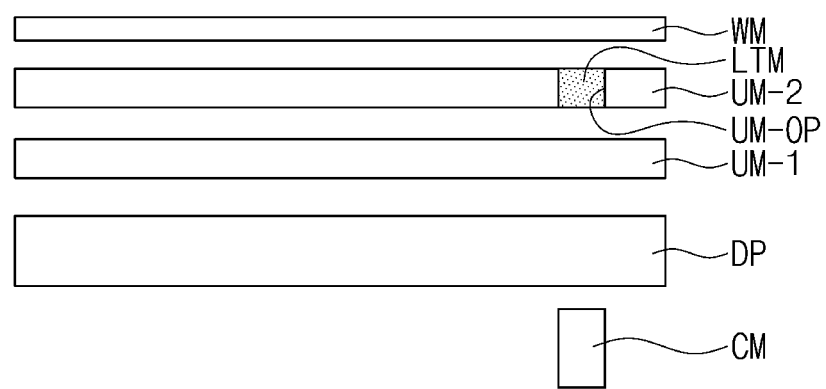

FIGS. 8A to 8C are cross-sectional views illustrating the display device DD according to an embodiment of the present inventive concept. Hereinafter, detailed description regarding the same component as that described with reference to FIGS. 1 to 7C will be omitted. In FIGS. 8A to 8C, an adhesive layer between members is not illustrated.

As illustrated in FIG. 8A, the optical controller LTM may be disposed on the window WM. For example, the optical controller LTM may be directly disposed on a top surface of the window WM. For example, the optical controller LTM may be disposed directly on a top surface of the base substrate of the window WM.

As illustrated in FIG. 8B, the optical controller LTM may be disposed on the input sensor UM-1. For example, the optical controller LTM may directly disposed on a top surface of the input sensor UM-1. For example, the optical controller LTM may be disposed directly on a top surface of the insulation layer covering the conductive pattern of the input sensor UM-1.

As illustrated in FIG. 8C, the optical controller LT4 may be disposed inside the opening UM-OP of the optical member UM-2. For example, a composition in which the dye or the pigment is mixed with the binder at a predetermined composition ratio may be filled in the opening UM-OP of the optical member UM-2.

As described above, the optical signal may move through the display area. The area through which the optical signal moves is not recognized as the non-display area to the user. Since a physical optical signal transmission hole is not applied to the display panel, the user may not recognize the area through which the optical signal moves through the appearance of the display device.

The defect such as the black-out phenomenon or the rainbow mum might not be generated in the image photographed by the camera module. This is because the area of the polarizer and/or the retarder corresponding to the area through which the optical signal moves of the display panel is removed (e.g., patterned).

Since the optical controller is disposed in correspondence to the area through which the optical signal moves, the patterning of the polarizer and/or the retarder is not recognized by the user. This is because the optical controller compensate the transmission amount and/or reflection amount of the external light of the area on which the polarizer and/or the retarder is not disposed in correspondence to the transmission amount and/or reflection amount of the external light of the area on which the polarizer and/or the retarder is disposed.

While the present inventive concept has been described with reference to embodiments thereof, it will be understood by those of ordinary skill in the art that various changes in form and details may be made thereto without departing from the spirit and scope of the present inventive concept.

What is claimed is:

1. A display device comprising:
   a window;
   a polarizer disposed below the window and including an opening;
   a display panel disposed below the polarizer and comprising a first display area and a second display area that has a pixel density lower than that of the first display area, wherein the second display area overlaps the opening of the polarizer, and
   an optical controller overlapping the second display area and is disposed on the display panel, wherein the optical controller reduces a transmittance of an optical signal, wherein the optical controller is disposed on a top surface of the window,
   wherein the optical controller includes a first electrode, a second electrode, an electrochromic element disposed between the first electrode and the second electrode, wherein the second electrode is disposed on the top surface of the window.

2. The display device of claim 1, wherein the electrochromic element comprises a reduction discoloration material layer, an oxidation discoloration material layer and an electrolyte layer, wherein the reduction discoloration material layer and the oxidation discoloration material layer are disposed between the first electrode and the second electrode, and the electrolyte layer is disposed between the reduction discoloration material layer and the oxidation discoloration material layer.

3. The display device of claim 1, wherein the optical controller comprises a thin-film having a predetermined color, and the thin-film has substantially the same light transmittance as the polarizer.

4. The display device of claim 1, wherein the optical controller comprises a thin-film containing a dye or a pigment.

5. The display device of claim 1, wherein each of the first display area and the second display area comprises a plurality of unit pixel areas, and the number of the unit pixel areas per unit area in the second display area is less than that in the first display area.

6. The display device of claim 5, wherein each of the plurality of unit pixel areas comprises a first color light emitting area, a second color light emitting area, and a third color light emitting area, wherein the first color light emitting area, the second color light emitting area, and the third color light emitting area display different colors from one another.

7. The display device of claim 6, wherein each of the plurality of unit pixel areas comprises two second color light emitting areas.

8. The display device of claim 1, wherein the first display area comprises a plurality of first unit pixel areas,
wherein the second display area comprises a plurality of second unit pixel areas and a plurality of non-unit pixel areas,
wherein each of the plurality of second unit pixel areas comprises a light emitting element disposed on an insulation layer, and
wherein each of the plurality of non-unit pixel areas comprises an opening provided in an insulation layer.

9. The display device of claim 8, wherein each of the plurality of first unit pixel areas and the plurality of second unit pixel areas comprises at least three light emitting areas, and
each of the non-unit pixel areas has an area greater than a sum of areas of at least two light emitting areas of the three light emitting areas.

10. The display device of claim 1, further comprising an input sensor disposed between the display panel and the polarizer.

11. The display device of claim 1, wherein the first display area at least partially surrounds the second display area.

12. An electronic device comprising:
a display device; and
a camera module disposed below the display device,
wherein the display device comprises:
a window;
an optical member disposed below the window and including an opening;
a display panel comprising a first display area and a second display area, where a plurality of first unit pixel areas are disposed on the first display area, wherein a plurality of second unit pixel areas and a plurality of non-unit pixel areas are disposed on the second display area, wherein the second display area overlaps the opening of the optical member;
an optical controller overlapping the second display area and disposed on the display panel; and
an input sensor disposed below the optical member, wherein the optical controller is disposed on the input sensor, and an upper surface of the optical controller is disposed below an upper surface of the optical member,
wherein the camera module overlaps the second display area,
wherein the optical controller includes a first electrode, a second electrode, an electrochromic element disposed between the first electrode and the second electrode.

13. The electronic device of claim 12, wherein the optical member comprises at least one of a polarizing film or a retarder film.

14. The electronic device of claim 13, wherein the optical controller has substantially the same light transmittance as the polarizing film.

15. The electronic device of claim 12, wherein the optical controller overlaps the camera module.

16. The electronic device of claim 12, wherein the optical controller overlaps the opening of the optical member.

* * * * *